(12) United States Patent
Wu et al.

(10) Patent No.: US 7,355,904 B2
(45) Date of Patent: Apr. 8, 2008

(54) METHOD AND APPARATUS FOR DRAIN PUMP OPERATION

(75) Inventors: Yonggang Wu, Santa Clara, CA (US); Nian Yang, Mountain View, CA (US); Boon-Aik Ang, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 100 days.

(21) Appl. No.: 11/423,645

(22) Filed: Jun. 12, 2006

(65) Prior Publication Data
US 2007/0286006 A1    Dec. 13, 2007

(51) Int. Cl.
*G11C 7/00* (2006.01)
(52) U.S. Cl. ............................. 365/189.09; 365/189.11
(58) Field of Classification Search ............ 365/189.09, 365/189.11, 206; 327/538, 540
See application file for complete search history.

(56) References Cited

U.S. PATENT DOCUMENTS

| | | | |
|---|---|---|---|
| 5,263,000 A * | 11/1993 | Van Buskirk et al. .. | 365/185.33 |
| 5,703,827 A * | 12/1997 | Leung et al. .......... | 365/230.06 |
| 6,178,129 B1 * | 1/2001 | Chen ...................... | 365/206 |
| 6,760,262 B2 * | 7/2004 | Haeberli et al. ....... | 365/189.09 |

\* cited by examiner

*Primary Examiner*—Vu A. Le
(74) *Attorney, Agent, or Firm*—Ingrassia Fisher & Lorenz, P.C.

(57) ABSTRACT

A method and apparatus are provided for improved noise reduction from switching on and off drain pumps (202) in a high voltage generator. The drain pumps (202) are divided into groups (204) and activation of the groups (204) of drain pumps (202) is staggered (304, 310). In addition, when drain pumps are switched on and off for power conservation or to maintain a steady state high voltage level, the groups (204) of drain pumps (202) are switched on and off in response to various predetermined high voltage levels (410, 412, 414, 416), with different voltage levels for different groups (204) of drain pumps (202).

20 Claims, 4 Drawing Sheets

METHOD AND APPARATUS FOR DRAIN PUMP OPERATION

FIELD OF THE INVENTION

The present invention generally relates to semiconductor high voltage generating circuits such as drain pumps, and more particularly relates to a method and apparatus for reduced noise drain pump operation.

BACKGROUND OF THE INVENTION

Drain pumps and similar high voltage generating circuits are utilized to provide high voltage and/or high current for semiconductor operation. For example, in semiconductor memory devices, drain pumps are used to provide high voltage and high current for programming memory cells. Typically, drain pumps include large capacitors. To conserve power, the drain pumps are turned on and off frequently depending on the output voltage thereof. Because of the capacitors, each time the drain pumps are turned on or turned off, they create noise on the power buses (e.g., Vcc and Vss). In addition, while the drain pumps are ramping up to a steady state voltage level after being turned on, they also create noise on the power buses. This noise increases as the size of the drain pump increases. Some circuits, particularly voltage reference circuits in semiconductor memory devices, require a very quiet power bus and the noise from the drain pumps is generally unacceptable.

Accordingly, it is desirable to provide a method and apparatus for drain pump operation which conserves power while reducing the noise generated by conventional power conservation schemes. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method and apparatus is provided for improved drain pump operation in a semiconductor device wherein high voltage generating circuits have been divided into two or more groups. In accordance with a first aspect of the present invention, a high voltage controller of the semiconductor device is coupled to the two or more groups of high voltage generating circuits and enables a first group thereof in response to a ramping state initiation signal and enables a second group a predetermined time interval after detecting the ramping state initiation signal.

In accordance with a second aspect of the present invention, the semiconductor device includes a voltage detector which generates a first voltage low signal in response to detecting a voltage level lower than a first predetermined voltage level and generates a first voltage high signal in response to detecting a voltage level higher than a second predetermined voltage level higher than the first predetermined voltage level. The high voltage controller is coupled to the voltage detector and disables a first group of the two or more groups of high voltage generating circuits in response to the first voltage low signal and enables the first group in response to the first voltage high signal.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
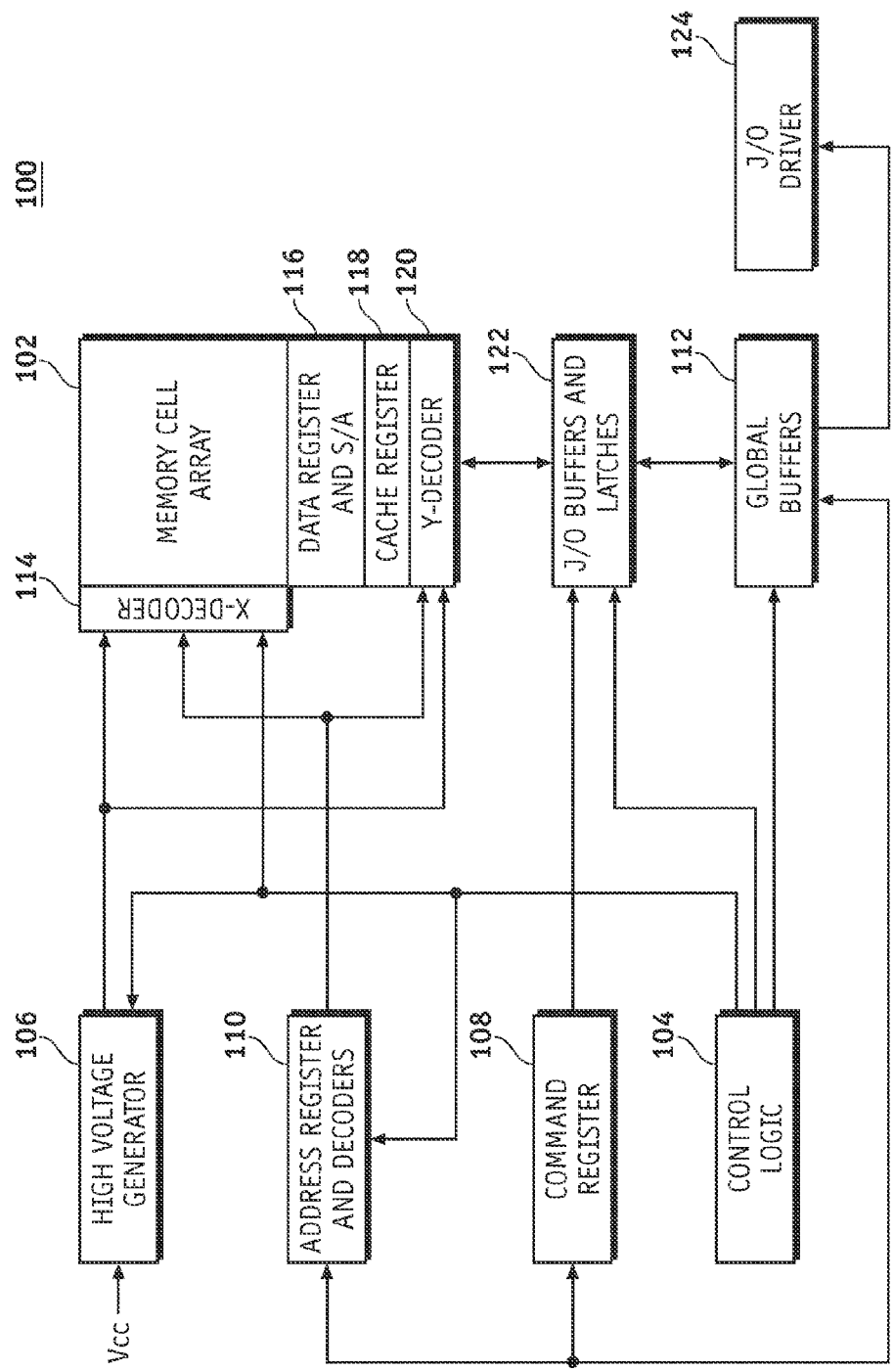
FIG. 1 is a block diagram of a semiconductor memory device in accordance with the present invention.

Referring to FIG. 1, a non-volatile semiconductor memory device 100, such as a flash memory device, includes a memory cell array 102, control logic 104 such as a state machine, a high-voltage generator 106, a command register 108, an address register and decoder 110, a global buffer 112, an X-decoder 114, a data register and sense amplifier 116, a cache register 118, a Y-decoder 120, an Input/Output (I/O) buffer and latch circuit 122, and an input/output driver 124.

The memory cell array 102 includes rewritable non-volatile memory cells that are arranged along word lines and bit lines in a matrix fashion well-known to those skilled in the art. Each of the memory cells is a cell wherein the write function is performed through hot electron injection. In this embodiment, SONOS-type cells may be employed as the non-volatile memory cells. The state machine 104 controls the operation of each circuit in the device in response to each control signal.

In accordance with the present invention, the high-voltage generating circuit 106 generates high voltages that are used within the semiconductor device for memory operations thereof by applying the high voltages to selected cells within the memory cell array 102 via the X-Decoder 114 and the Y-Decoder 120. The high voltages used within the semiconductor memory device include a high voltage for writing data, a high voltage for erasing data, a high voltage for reading data, and a verifying high voltage for checking whether sufficient write/erase has been performed on a subject memory cell at the time of writing or erasing data.

The command register 108 temporarily stores operation commands that are input through the global buffer 112. The address register and decoder 110 temporarily stores input address signals. The I/O buffer and latch circuit 122 controls various signals or data corresponding to I/O terminals. The input/output driver 124 controls the data to be output from the semiconductor memory device 100 and the data to be input thereto.

Figure 2:
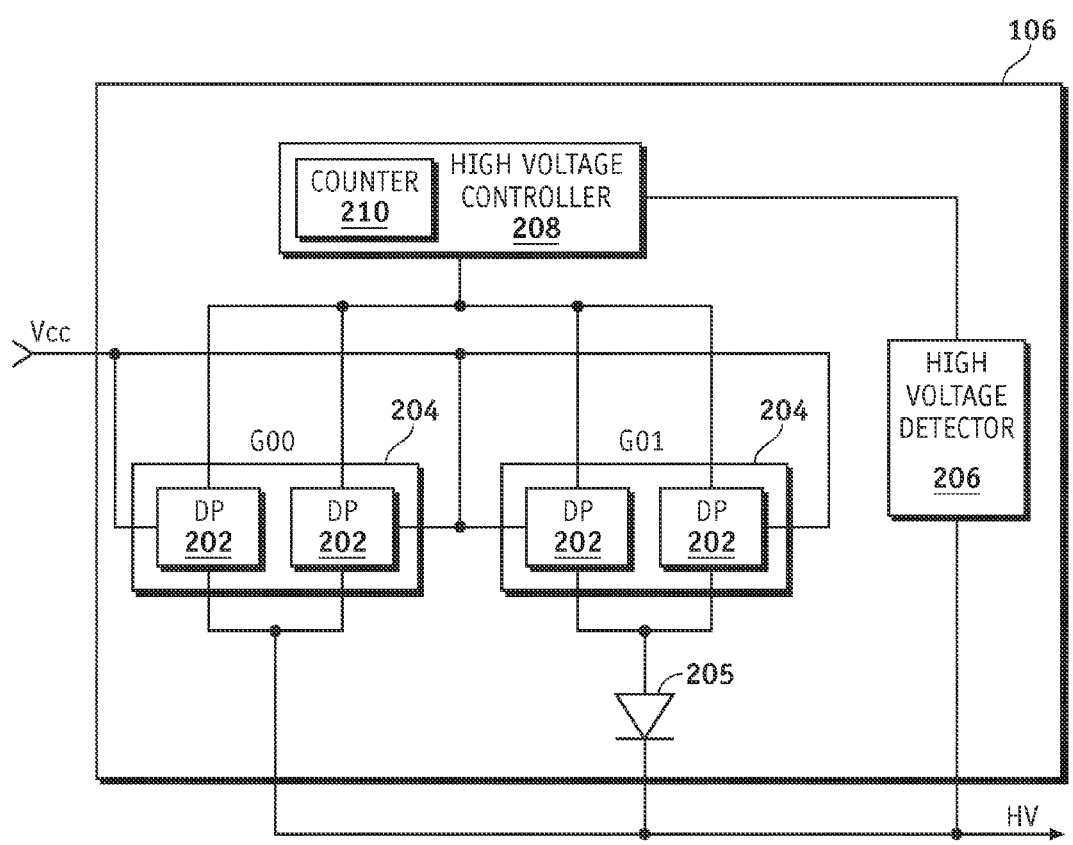
FIG. 2 is a high voltage generator in accordance with embodiments of the present invention.

Referring to FIG. 2, a high-voltage generating circuit 106 in accordance with the present invention includes a plurality of high voltage generating circuits 202, such as drain pumps, arranged into two or more groups 204 thereof. For example, two groups 204, G00 and G01, are shown. The outputs of the drain pumps 202 provide high voltage power to the semiconductor device 100 for operation thereof. A current flow control device 205, such as a diode, is coupled between the output of one group G00 of the drain pumps 202 and another group G01 of the drain pumps 202. The diode 205 prevents current from flowing from the first group G00 to the second group G01 while the first groups is generating a target high voltage level and the second group G01 is not generating a voltage level or is generating a voltage level less than the target voltage level. The outputs of the drain pumps 202 are also coupled to a voltage level detector 206 which detects the high voltage level output therefrom and provides control signals to the high voltage controller 208.

The high voltage controller 208 receives a ramping initiation signal from the control logic 104 (FIG. 1) of the semiconductor device to begin generating high voltage for the operation of the semiconductor device in accordance with the present invention. Additionally, the high voltage controller 208 includes a counter 210 for determining time intervals for operation of the high voltage generator 106 in accordance with a first embodiment of the present invention as described hereinbelow. Further, the high voltage controller 208 receives a voltage level signal from the voltage level detector 206 and, in response to the voltage level signal, controls the groups 204 of drain pumps 202 to conserve power while reducing noise in the semiconductor device 100 from enabling and disabling the groups 204 in accordance with a second embodiment of the present invention as described below.

Figure 3:
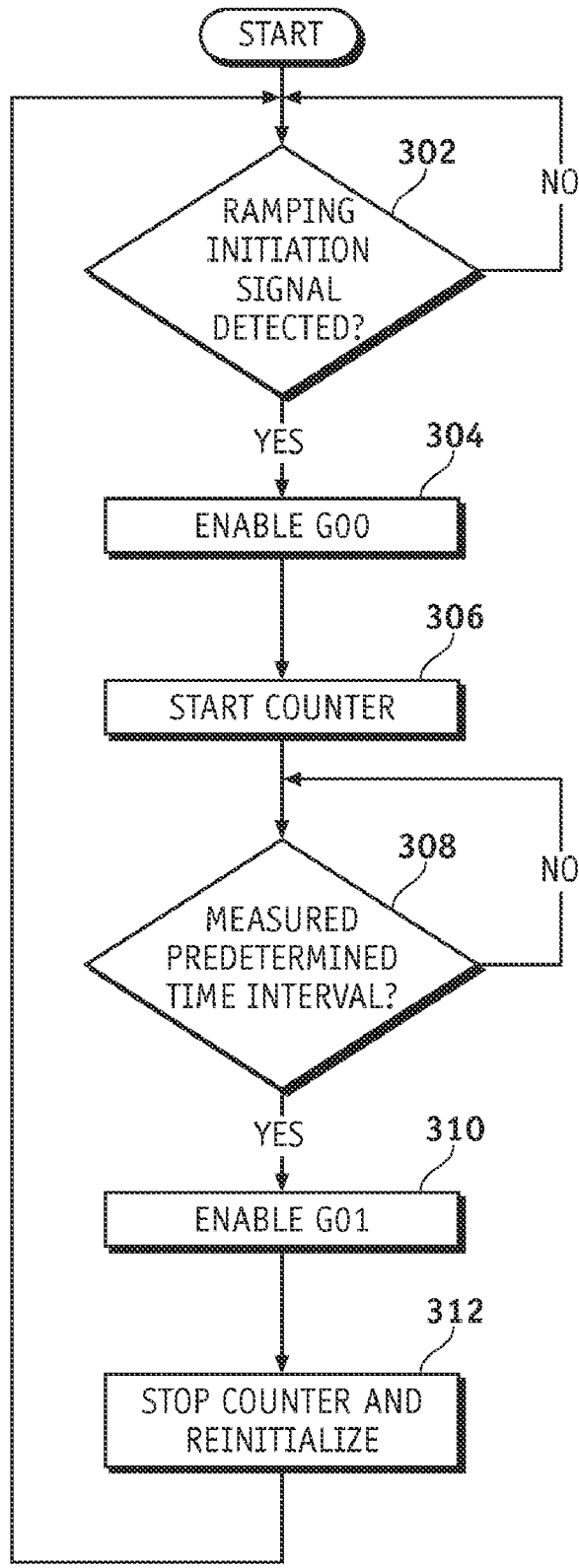
FIG. 3 is a flowchart of a method for reduced noise drain pump operation in accordance with the first embodiment of the present invention.

Referring next to FIG. 3, a flowchart depicting operation of the high voltage controller 208 in accordance with a first embodiment of the present invention initially determines whether a ramping initiation signal has been received 302 from the control logic 104. When the ramping initiation signal is received 302, in accordance with the first embodiment of the present invention, the controller 208 enables 304 the first group G00 of the groups 204 of drain pumps 202 to ramp up to a steady state of high voltage generation. The controller 208 also starts 306 the counter 210 to begin counting a predetermined time interval after detection of the ramping state initiation signal.

When the counter 210 has measured the predetermined time interval 308, the controller 208 enables 310 the second group G01 of the groups 204 of drain pumps 202. By staggering the initiation of the groups 204 of drain pumps 202, the noise created by switching the drain pumps 202 is reduced, thereby improving the operation of the semiconductor device 100. This is particularly true for semiconductor memory devices 100 which comprise voltage reference circuits that require a very quiet power bus.

In the present embodiment, there are two groups 204 of drain pumps 202. The present invention is equally applicable to more than two groups 204 of drain pumps. With additional groups 204, the controller 208 can initiate the groups 204 at three or more different times spaced apart by the predetermined time interval, repeating steps 306, 308 and 310. After the group is enabled 310, the counter is stopped and reinitialized 312 and processing returns to await reception of the next ramping initiation signal 302. The diode 205 prevents current from flowing into later-activated drain pumps 202 as the earlier-activated drain pumps 202 provide voltage signals at a high voltage level for operation of the semiconductor device 100.

Figure 4:
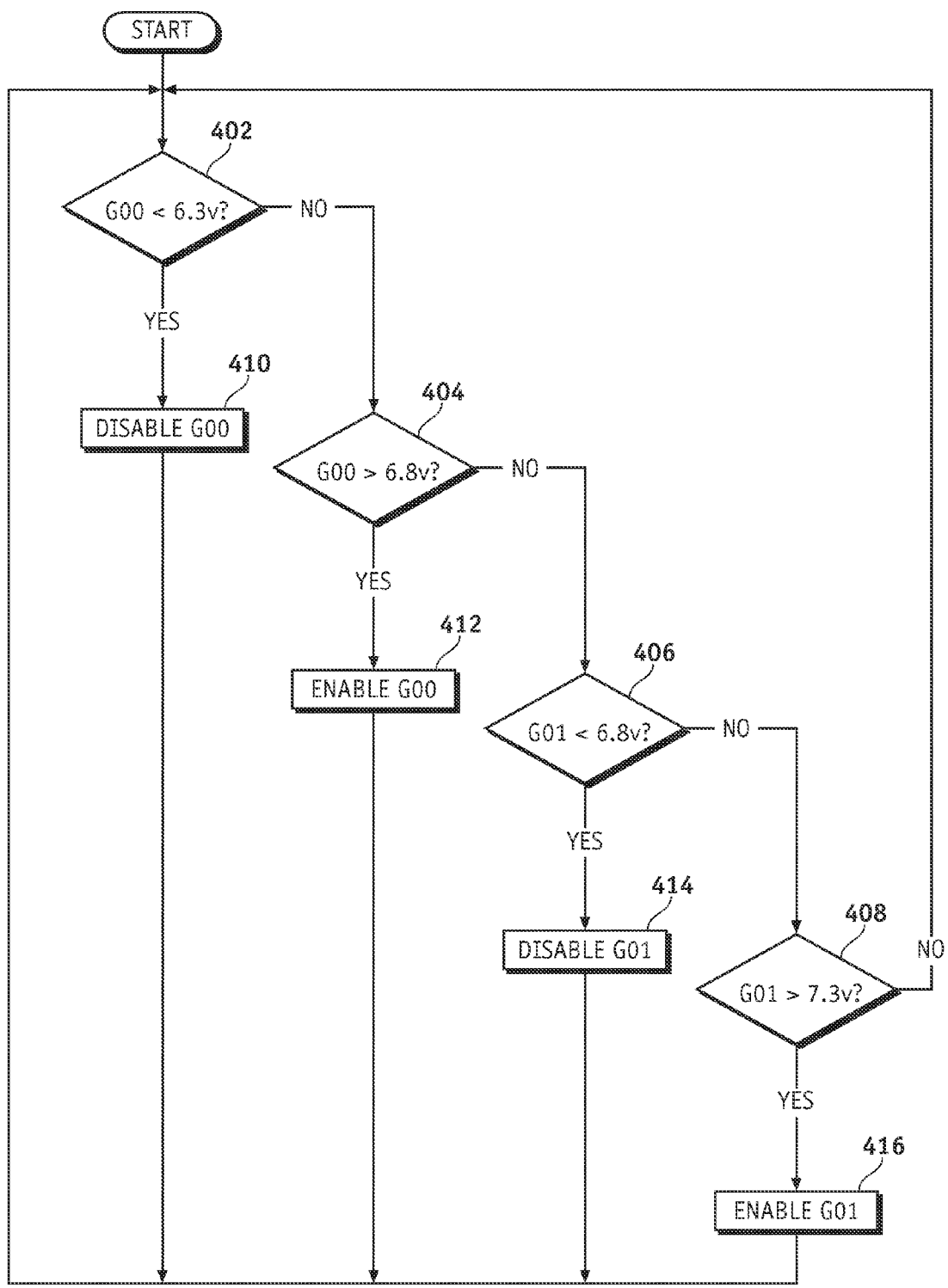
FIG. 4 is a flowchart of a method for reduced noise drain pump operation in accordance with a second embodiment of the present invention.

While the first embodiment of the present invention advantageously reduces noise during high voltage initiation, a second embodiment of the present invention provides beneficial noise reduction during the switching on and off of the drain pumps 202 during, for example, power conservation during steady state operation. Referring to FIG. 4, a flowchart depicting operation of the high voltage controller 208 in accordance with the second embodiment initially examines the high voltage output of G00 to determine whether the high voltage output signal is less than a first predetermined voltage level 402, more than a second predetermined voltage level 404, less than the second predetermined voltage level 406 or more than a third predetermined voltage level 408. Preferably for a semiconductor nonvolatile memory device, such as a Flash memory device, where high voltages are used for program, erase and read functions, the predetermined voltage levels are 0.5 volts apart and the first predetermined voltage level is, for example, 6.3 volts, the second predetermined voltage level is 6.8 volts and the third predetermined voltage level is 7.3 volts.

If a voltage level lower than the first predetermined voltage level (6.3 volts) is detected 402, the first group G00 of drain pumps 202 is disabled 410 and processing in accordance with the first embodiment of the present invention returns to await the next voltage level detection 402, 404, 406, 408. If a voltage level higher than the second predetermined voltage level (6.8 volts) is detected 402, the first group G00 of drain pumps 202 is enabled 412 and processing again returns to await the next voltage level detection 402, 404, 406, 408. If a voltage level lower than the second predetermined voltage level (6.8 volts) is detected 402, the second group G01 of drain pumps 202 is disabled 414 and processing in accordance with the first embodiment of the present invention returns 402, 404, 406, 408. And if a voltage level lower than the third predetermined voltage level (7.3 volts) is detected 402, the second group G01 of drain pumps 202 is disabled 416 and processing in accordance with the first embodiment of the present invention returns to await the next voltage level detection 402, 404, 406, 408.

In accordance with this second embodiment of the present invention, power can be conserved by switching the drain pumps 202 off and on, while the noise conventionally generated by such power conservation methods can be greatly reduced through staggering the switching of the drain pumps. In the present embodiment, two groups 204 of two drain pumps 202 each are depicted. However, those skilled in the art will recognize that there could be only one drain pump 202 per group 204 or, alternatively, there may be more than two groups 204, or more than two drain pumps 202 per group 204. The number of drain pumps 202 will vary in accordance with the design of the semiconductor device 100 and the high voltage requirements thereof. In addition, the grouping of the drain pumps 202 into various groups 204 (i.e., the number of groups 204 and the number of drain pumps 202 per groups 204) can be designed in a manner best suited to reduced noise operation.

While at least one exemplary embodiment has been presented in the foregoing detailed description of the invention, it should be appreciated that a vast number of variations exist. For example, the description above describes a semiconductor memory device embodiment of the present invention. However, the present invention is not limited to this embodiment and the high voltage generator 106 could be implemented in any semiconductor device to provide the benefits and advantages of the present invention for the operation thereof. In addition, the first embodiment of the present invention and the second embodiment of the present invention can either one be implemented or both implemented in a high voltage generator 106. It should also be appreciated that the exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the claims. Accordingly, the scope of the present invention is only limited by the claims hereinbelow and their equivalents.

What is claimed is:

1. A method for reduced noise operation in a semiconductor device comprising two or more groups of high voltage generating circuits, the method comprising the steps of:
    enabling a first group of the two or more groups of high voltage generating circuits in response to a ramping state initiation signal; and
    enabling a second group of the two or more groups of high voltage generating circuits a predetermined time interval after detecting the ramping state initiation signal.

2. The method of claim 1 further comprising the steps of:
    disabling the first group of the two or more groups of high voltage generating circuits in response to detecting a voltage level lower than a first predetermined voltage level and enabling the first group of the two or more groups of high voltage generating circuits in response to detecting a voltage level higher than a second predetermined voltage level higher than the first predetermined voltage level; and
    disabling the second group of the two or more groups of high voltage generating circuits in response to detecting a voltage level lower than the second predetermined voltage level and enabling the second group of the two or more groups of high voltage generating circuits in response to detecting a voltage level higher than a third predetermined voltage level higher than the second predetermined voltage level.

3. The method in accordance with claim 2 wherein the second predetermined voltage level is 0.5V higher than the first predetermined voltage level.

4. The method in accordance with claim 2 wherein the third predetermined voltage level is 0.5V higher than the second predetermined voltage level.

5. A semiconductor device comprising:
    two or more groups of high voltage generating circuits; and
    a high voltage controller coupled to the two or more groups of high voltage generating circuits and enabling a first group of the two or more groups of high voltage generating circuits in response to a ramping state initiation signal and enabling a second group of the two or more groups of high voltage generating circuits a predetermined time interval after detecting the ramping state initiation signal.

6. The semiconductor device of claim 5 further comprising a current flow control device coupled between the first group of the two or more groups of high voltage generating circuits and the second group of the two or more groups of high voltage generating circuits to prevent current from flowing from the first group of the two or more groups of high voltage generating circuits to the second group of the two or more groups of high voltage generating circuits until the second group of the two or more groups of high voltage generating circuits generates a voltage level equivalent to a target voltage level.

7. The semiconductor device of claim 3 wherein each of the high voltage generating circuits is a drain pump.

8. The semiconductor device of claim 3 wherein the current flow control device is a diode.

9. The semiconductor device of claim 3 wherein the semiconductor device is a semiconductor memory device.

10. The semiconductor device of claim 9 wherein the semiconductor memory device is a nonvolatile memory device.

11. A method for reduced noise operation in a semiconductor device comprising two or more groups of high voltage generating circuits, the method comprising the steps of:
    disabling a first group of the two or more groups of high voltage generating circuits in response to detecting a voltage level lower than a first predetermined voltage level and enabling the first group of the two or more groups of high voltage generating circuits in response to detecting a voltage level higher than a second predetermined voltage level higher than the first predetermined voltage level; and
    disabling a second group of the two or more groups of high voltage generating circuits in response to detecting a voltage level lower than the second predetermined voltage level and enabling the second group of the two or more groups of high voltage generating circuits in response to detecting a voltage level higher than a third predetermined voltage level higher than the second predetermined voltage level.

12. The method in accordance with claim 11 wherein the second predetermined voltage level is 0.5V higher than the first predetermined voltage level.

13. The method in accordance with claim 11 wherein the third predetermined voltage level is 0.5V higher than the second predetermined voltage level.

14. A semiconductor device comprising:
    two or more groups of high voltage generating circuits;
    a voltage detector generating a first voltage low signal in response to detecting a voltage level lower than a first predetermined voltage level and generating a first voltage high signal in response to detecting a voltage level higher than a second predetermined voltage level higher than the first predetermined voltage level; and
    a high voltage controller coupled to the voltage detector and the two or more groups of high voltage generating circuits and disabling a first group of the two or more groups of high voltage generating circuits in response to the first voltage low signal and enabling the first group of the two or more groups of high voltage generating circuits in response to the first voltage high signal.

15. The semiconductor device of claim 14 wherein the second predetermined voltage level is 0.5V higher than the first predetermined voltage level.

16. The semiconductor device of claim 14 wherein the voltage detector generates a second voltage low signal in response to detecting a voltage level lower than the second predetermined voltage level and generates a second voltage high signal in response to detecting a voltage level higher than a third predetermined voltage level higher than the second predetermined voltage level, and
    wherein the high voltage controller disables a second group of the two or more groups of high voltage generating circuits in response to the second voltage low signal and enables the second group of the two or more groups of high voltage generating circuits in response to detecting the second voltage high signal.

17. The semiconductor device of claim 16 wherein the third predetermined voltage level is 0.5V higher than the second predetermined voltage level.

18. The semiconductor device of claim 14 wherein the semiconductor device is a semiconductor memory device.

19. The semiconductor device of claim 18 wherein the semiconductor memory device is a nonvolatile memory device.

20. The semiconductor device of claim 14 wherein each of the high voltage generating circuits is a drain pump.

* * * * *